United States Patent
Kusamori et al.

(10) Patent No.: US 12,002,723 B2
(45) Date of Patent: Jun. 4, 2024

(54) SEALING LID FORMED FROM TRANSLUCENT MATERIAL

(71) Applicant: TANAKA KIKINZOKU KOGYO K.K., Tokyo (JP)

(72) Inventors: Hiroyuki Kusamori, Hiratsuka (JP); Tomohiro Shimada, Hiratsuka (JP); Takeshi Iribe, Hiratsuka (JP); Noriyuki Kudo, Tokyo (JP); Katsunao Tanaka, Tokyo (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 975 days.

(21) Appl. No.: 16/967,207

(22) PCT Filed: Feb. 12, 2019

(86) PCT No.: PCT/JP2019/004772
§ 371 (c)(1),
(2) Date: Aug. 4, 2020

(87) PCT Pub. No.: WO2019/159858
PCT Pub. Date: Aug. 22, 2019

(65) Prior Publication Data
US 2020/0365474 A1    Nov. 19, 2020

(30) Foreign Application Priority Data
Feb. 13, 2018 (JP) ................. 2018-023249

(51) Int. Cl.
*H01L 21/00* (2006.01)
*B23K 1/00* (2006.01)
(Continued)

(52) U.S. Cl.
CPC ............ *H01L 23/06* (2013.01); *B23K 1/0016* (2013.01); *B23K 35/30* (2013.01)

(58) Field of Classification Search
CPC ........ H01L 23/06; B23K 1/0016; B23K 35/30
See application file for complete search history.

(56) References Cited

U.S. PATENT DOCUMENTS 6,627,814 B1    9/2003  Stark
2006/0102923 A1  5/2006  Oda et al.
(Continued)

FOREIGN PATENT DOCUMENTS

EP    2 043 146 A1    4/2009
JP    S58-127474 A    7/1983
(Continued)

OTHER PUBLICATIONS

Extended European Search Report dated Dec. 16, 2020 for corresponding European Patent Application No. 19754079.2.
(Continued)

*Primary Examiner* — Richard A Booth
(74) *Attorney, Agent, or Firm* — Foley & Lardner LLP

(57) ABSTRACT

The present invention relates to a sealing lid for a package containing an optical element. For the sealing lid, a translucent material such as glass that can transmit light such as visible light is used. The present invention includes a lid main body made of the translucent material. The lid main body includes a joining region having a frame shape corresponding to an outer circumferential shape of the lid main body. A plurality of pieces of brazing material made of a eutectic alloy are fused on the joining region of the lid main body. An arrangement state of the brazing material includes aligning spherical pieces of brazing material continuously to form a frame shape along the joining region.

17 Claims, 7 Drawing Sheets

(51) Int. Cl.
   *B23K 35/30*   (2006.01)
   *H01L 23/06*   (2006.01)

(56) References Cited

U.S. PATENT DOCUMENTS

| | | |
|---|---|---|
| 2006/0164631 A1 | 7/2006 | Choi et al. |
| 2009/0020866 A1 | 1/2009 | Fujino et al. |
| 2012/0097734 A1 | 4/2012 | Diep |
| 2016/0375526 A1 | 12/2016 | Iseki |

FOREIGN PATENT DOCUMENTS

| | | | |
|---|---|---|---|
| JP | H07-249750 A | 9/1995 |
| JP | H09-36690 A | 2/1997 |
| JP | 2000-311993 A | 11/2000 |
| JP | 2003-142621 A | 5/2003 |
| JP | 2004-146392 A | 5/2004 |
| JP | 2006-145610 A | 6/2006 |
| JP | 2007-242642 A | 9/2007 |
| JP | 2008-147234 A | 6/2008 |
| JP | 2008-311456 A | 12/2008 |

OTHER PUBLICATIONS

International Searching Authority, "International Search Report," issued in connection with International Patent Application No. PCT/JP2019/004772, dated Apr. 23, 2019.

International Searching Authority, "Written Opinion," issued in connection with International Patent Application No. PCT/JP2019/004772, dated Apr. 23, 2019.

Lid main body

Joining region

Lid main body

Joining region

Lid main body

Joining region

Lid main body

Joining region

Brazing material is aligned in single row

Brazing material is aligned in two rows

Shape index: 0.70

Shape index: 0.99

Shape index: 1.23

Shape index: 1.68

Shape index: 2.52

SEALING LID FORMED FROM TRANSLUCENT MATERIAL

RELATED APPLICATIONS

The present application claims priority under 37 U.S.C. § 371 to International Patent Application No. PCT/JP2019/004772, filed Feb. 12, 2019, which claims priority to and the benefit of Japanese Patent Application No. 2018-023249, filed on Feb. 13, 2018. The contents of these applications are hereby incorporated by reference in their entireties.

FIELD

The present invention relates to a sealing lid that serves as a lid member for a package containing an optical element such as a light emitting diode (LED) and that is made of a translucent material. The present invention particularly relates to a sealing lid that includes a lid main body provided with a brazing material to be joined to the package for hermetic sealing, with a low risk of damage such as breaking during a sealing step.

BACKGROUND ART

Optical elements including light emitting elements such as an LED and a light receiving element have been widely used in fields such as lighting, sensors, optical communications, and sterilization. When such an optical element is used in devices of various types described above, the optical element is sealed in an airtight package for protection from the atmosphere. This package is made by joining a lid (lid body) to a package main body that has a container form for the optical element to be housed in, thus securing airtightness.

In packaging an optical element, a prerequisite for exerting its intended function is to use a lid capable of transmitting light (such as visible light, inferred light, and ultraviolet light). Patent document 1 discloses an example of a such a light transmitting optical element package. The package is formed with a metal cap (lid) with a glass window joined to a package main body. In this related art, a part of the lid is the glass window for transmitting light, and a metal frame is used at the part where the lid is joined to the package main body. The joined part is subjected to seam welding to secure airtightness.

Patent document 2 discloses a light emitting element package produced with an adhesive used for joining a lid that is a flat light transmitting glass plate to a package main body containing a semiconductor chip (light emitting element). In this related art, the entirety of the lid is made of light transmitting glass, and the adhesive is used under the assumption that the lid and the package main body are made of different materials.

RELATED ART DOCUMENTS

Patent Documents

[Patent Document 1] JP2006-145610A
[Patent Document 2] JP2007-242642A

SUMMARY

Technical Problem

Of the optical element packages described above, the package using the lid with the glass window disclosed in Patent document 1 is disadvantageous in terms of low efficiency of usage of light from the element due to the non-transmissive nature of the metal frame. Furthermore, the glass window and the metal frame of the lid recited in Patent document 1 are separate members made of different types of material. This means that the lid includes a larger number of parts, resulting in a complex structure. Thus, the package is disadvantageous in terms of production efficiency and cost, and is also difficult to downsize.

Considering these disadvantages of the package recited in Patent document 1, it is advantageous in terms of the efficiency of usage of light from the element that the lid recited in Patent document 2 is made entirely of a translucent material such as glass. However, the lid of the package recited in Patent document 2 is joined/sealed using an adhesive made of a resin/organic material. Such material has a risk of deterioration over time, in particular, deterioration due to ultraviolet rays, to the detriment of long-term reliability of the package.

The present invention has been made against the background of the above-described circumstances, and provides a lid that serves as a lid member for sealing a package containing an optical element and that has never been put into practical use. Specifically, the sealing lid is different from a combined member of a glass window and a metal frame in that efficiency of utilization of the optical element is secured. Furthermore, the sealing lid can be joined to the package main body with effective hermetic sealing, and enables formation of a joined portion that is stable for a long period of time without deterioration.

Solution to Problem

When the efficiency of the utilization of light emitted/received to/from the optical element is prioritized, the lid needs no non-transmissive part such as a metal frame. Instead, the lid is preferably made entirely of a translucent material. When the lid is made entirely of a translucent material such as glass, it is necessary to consider joinability with the package main body, which in many cases made of ceramics. The joinability required in this context literally means that the lid is firmly joined to the package main body. The present invention further requires the lid to be joinable without excessively affecting the translucent material constituting the lid. This is because many translucent materials such as glass are vulnerable materials with low rigidity, and thus may be broken by thermal stress or the like.

The inventors conducted extensive study and research, and came up with an idea of: using a translucent material such as glass for the lid main body; using a brazing material made of a eutectic alloy as a joining material for sealing and joining the lid main body to the package main body; and arranging the brazing material at an appropriate position and fusing the brazing material. The inventors have arrived at the present invention based on an idea that the sealing lid thus configured can solve the problems described above.

Specifically, a sealing lid according to the present invention is joinable to a package main body containing an optical element and is for producing a package hermetically sealed, and includes a lid main body made of a translucent material through which at least one of visible light, ultraviolet light, and infrared light is transmittable. The lid main body has a joining region having a frame shape corresponding to an outer circumferential shape of the lid main body, the joining region being formed on a surface of the lid main body that is to be joined to the package main body. A plurality of pieces of brazing material made of a eutectic alloy are fused on the joining region of the lid main body.

In the present invention, the lid main body is made of a single material, namely, a translucent material. This is for the purpose of achieving the highest possible efficiency of utilizing light of the optical element in the package. The brazing material is made of a eutectic alloy and used as a joining material for joining the lid to the package. This is because by setting the alloy composition of the eutectic alloy to be close to a eutectic composition, the melting point can be set to be relatively low.

When a brazing material made of a eutectic alloy is fixed (fused) to the lid main body, setting the method/conditions for the fixing (fusing) appropriately ensures that the material structure and the shape after the fusion can be controlled. This control of the material structure and the shape is an important aspect of the present invention, and will be described in detail later.

A sealing lid according to the present invention will be described in detail below. As described above, the lid according to the present invention includes a lid main body made of a translucent material and a brazing material serving as a joining material in a sealing step.

A. Lid Main Body

A-1. Constituent Material, Shape, and the Like of Lid Main Body

As described above, the lid according to the present invention is made entirely of a translucent material, so that the light emitting/receiving function of the optical element can be fully utilized. The translucent material is a material through which at least one of visible light, ultraviolet light, and infrared light is transmittable. The wavelength of transmittable light is not particularly limited. Furthermore, the rate of transmission (transmittance) of light is not particularly limited, either. The specific type of this translucent material is preferably any of range of materials including glass, crystal, sapphire, silicon, and germanium. This glass is defined as a translucent material generally referred to as glass, and includes quartz glass (including synthetic glass), borosilicate glass, and the like.

The shape and the dimension of the lid body are not particularly limited. The shape and the dimension of the lid are determined based on the usage/specification of the package to which the optical element is applied. The shape of the lid may be a planer shape including a quadrangle (square, rectangle) or circular plate shape. The cross-sectional shape of the lid main body is not particularly limited, either. Both surfaces of the plate shape may be flat, or one or both surfaces may be provided with a recess and/or protrusion. The lid main body provided with a recess and/or protrusion to be in a dome or lens form can be used for the purpose of increasing the internal volume or for concentrating/diffusing light.

A-2. Joining Region

The lid main body has a joined surface that is joined to the package main body and that is provided with a joining region having a frame shape corresponding to the outer circumferential shape of the lid main body. The joining region is a portion to be entirely or partially in contact with and joined to the package main body via a brazing material in a hermetic sealing step. The joining region is a region having a frame shape corresponding to the outer circumferential shape of the lid main body. The region is a quadrangle frame if the outer circumferential shape of the lid main body is a quadrangle shape as illustrated in FIGS. 1(a) and 1(b), and is a circular frame (ring) if the outer circumferential shape is a circular shape as illustrated in FIG. 1(c). It should be noted that the shape of the joining region may not necessarily match the outer circumferential shape of the lid main body completely. As illustrated in FIG. 1(b), the joining region may have a shape with four rounded corners. Furthermore, the frame-shaped region corresponding to the outer circumferential shape may have any shape insofar as at least one of the outer frame or the inner frame conforms to the outer circumferential shape of the lid main body. As illustrated in FIG. 1(d), the joining region may have: an outer frame having a quadrangle shape conforming to the outer circumferential shape of the lid main body; and an inner frame having a circular shape. The width of the joining region is not particularly limited. The width of the joining region is set conveniently depending on the dimension of the package main body to be joined with the lid, such as the width of an opening end surface of the package main body having, for example, a container shape. Generally, the width is set to be equal to or larger than $1/20$ and equal to or less than $1/8$ of the dimension of the long side or the diameter of the lid main body. The width of the joining region may not necessarily be uniform insofar as the width is within the range described above.

B. Brazing Material Made of Eutectic Alloy

B-1. Constituent Element and Composition of Brazing Material

A eutectic alloy is an alloy that is made of two or more types of elements and that is able to develop a eutectic reaction. The eutectic reaction is a reaction causing components derived from the constituent elements of the alloy to be simultaneously crystallized into a solid form (solid phase) from a molten state (liquid phase). As described above, the eutectic alloy has a relatively low melting point in the eutectic composition (eutectic point). This ensures that thermal impact/thermal stress on the lid main body can be relatively reduced in both of the step of fusing the brazing material onto the lid main body and the step of joining the lid to the package main body.

An example of the brazing material made of a eutectic alloy used in the present invention is a Au-based eutectic brazing material. The Au-based eutectic brazing material is preferably a brazing material made of a eutectic alloy with a Au content of 50% or more. Examples of such a Au-based eutectic brazing material include a Au—Sn brazing material, a Au—Ge brazing material, a Au—Ga—In brazing material, a Au—Sb brazing material, a Au—Si brazing material, a Au—Ga brazing material, and a Au—In brazing material. These brazing materials have a relatively low melting point and, in addition, have so excellent a level of joining strength and chemical stability that maintains the airtightness of the package for a long period of time. These brazing materials also have so excellent a level of durability against ultraviolet rays that eliminates deterioration, as opposed to adhesives. Of these Au—Sn brazing materials, the Au—Sn brazing material is particularly preferable.

A preferable composition of the eutectic alloys is as follows. The concentration (% by mass) of all of the constituent elements relative to the composition to form the eutectic composition is preferably within a range of ±2%. This configuration is for the purpose of achieving a low melting point of the brazing material, developing fine eutectic structures, and preventing deposition of a coarse solid phase. Specifically, the above-described particularly preferable brazing materials, namely, the Au—Sn brazing material, the Au—Ge brazing material, and the Au—Ga—In brazing material are specified as follows. Preferably, the Au—Sn brazing material has a Sn concentration in a range between 19% and 23% by mass, both inclusive (the balance is Au); the Au—Ge brazing material has a Ge concentration in a range between 10% and 14% by mass, both inclusive (the balance is Au); and the Au—Ga—In brazing material has a Ga concentration in a range between 8% and 12% by mass, both inclusive, and has a In concentration in a range between 6% and 10% by mass, both inclusive (the balance is Au).

B-2. Mode of Brazing Material Fixing

In the present invention, the brazing material made of a eutectic alloy is fixed within the range defined by the joining region of the lid main body by fusing. The brazing material fused on the joining regions melts again in the step of sealing the package, and spreads within the joining region upon coming into contact with an opening end portion of the package main body. Then, the brazing material joins the lid main body to the opening end surface of the package main body, keeping the interior of the package hermetically sealed. As used herein, the term fusing refers to bringing the molten brazing material into contact with the lid main body and then curing the brazing material to join and fix the brazing material and the lid main body to each other in a surface contact state. The brazing material may be fused on the lid main body by heating and melting a solid brazing material placed on the lid main body. Alternatively, a brazing material in a molten state may be supplied to the lid main body. Preferable processes for fusing the brazing material will be described later.

In the present invention, a plurality of pieces of brazing material made of a eutectic alloy are fused on the joining region. This is for the purpose of deconcentrating the residual stress in the interface between the brazing material and the lid main body, thereby preventing the lid main body from breaking in the step of fusing the brazing material and in the step of sealing the package. The brazing material and the translucent material such as glass are different from each other in thermal expansion/contraction behavior. This causes residual stress to occur in the joining interface in the step of fusing the brazing material. A larger joining area of the brazing material results in a larger residual stress. Excessively large residual stress leads to a risk of damage such as cracking on the lid main body in the step of fusing the brazing material. For example, the brazing material fused may be a single piece of brazing material formed in a frame shape that is substantially the same as the joining region of the lid main body. Such a brazing material has a large joining area and thus has been confirmed to involve a higher risk of breaking the lid main body in the brazing material curing step (see the embodiment described later).

In view of this, in the present invention, a plurality of pieces of brazing material are fused to divide and reduce residual stress. The reduction in residual stress works together with the reduction in the thermal stress achieved by the use of the brazing material made of a eutectic alloy described above, and prevents the lid main body from cracking at the time of the fusion.

In the present invention, a plurality of pieces of brazing material are preferably arranged as follows. Small blobs of brazing material are continuously fused on the joining region in a frame shape arrangement in an external view (overview). FIG. 2 illustrates specific arrangements, where sphere or dot shaped pieces of brazing material are aligned along the shape of the joining region. In this example, the upper side of FIG. 2 illustrates the brazing material aligned in a single row to form a frame shape. Alternatively, as illustrated in the lower side of FIG. 2, the brazing material may be aligned in a plurality of rows to form the frame shape. The continuous arrangement is not limited to such an arrangement that the pieces of brazing material are fused while being in contact with each other. The continuous arrangement encompasses such an arrangement that the pieces of brazing material are fused while being separated from each other. The latter is more preferable as will be described later. In the present invention, the number of a plurality of pieces of brazing material thus fused and the dimension (volume) of each piece of the brazing material are not particularly limited, insofar as the amount of the brazing material dispersed and fused is large enough to spread over the entire circumference of the joining region of the lid main body in the sealing step. The lid main body is more likely to be affected in terms of damage and sealing quality by the cross-sectional structure and the shape of the brazing material than by the dimension of the brazing material or by the number of pieces of the brazing material arranged.

B-3. Material Structure of Brazing Material

As described above, the brazing material made of a eutectic alloy is used because the eutectic alloy develops a fine eutectic structure. With the fine eutectic structure obtained as the material structure of the brazing material, a coarse solid phase can be eliminated, whereby stable sealing can be achieved.

This will be described in more detail. When the brazing material is re-melted and cured in the sealing step, a coarse solid phase can be a cause of damage to the lid main body made of a translucent material. A coarse solid phase may in some cases have a high melting point, and thus may remain un-melted during brazing in the fusing step. In this case, it is possible for the joined portion formed after the sealing to be non-uniform in thickness, resulting in a possibility that airtightness is adversely affected. The presence of a coarse solid phase may cause some parts of the brazing material to have higher melting points. This may cause an excessive amount of thermal stress at these parts or uneven stress distribution in the joining interface. Low-rigidity translucent materials such as glass are largely affected by thermal stress, may undergo cracking and/or breaking during the sealing. In view of this, in the present invention, the material structure of the brazing material fused to the lid main body is preferably a fine structure.

Specifically, the material structure of a random cross section of at least one of the plurality of pieces of brazing material fused on the joining region is preferably a material structure made of a eutectic structure and an optional single phase having an equivalent circle diameter of equal to or less than 5 μm. The eutectic structure according to the present invention is equivalent in meaning to a general eutectic structure, and is one form of a material structure including a plurality of fine solid phases arranged in a complicated, periodic/composite manner. The material structure of the brazing material according to the present invention inevitably involves development of a eutectic structure having a periodic fine structure. In addition to this eutectic structure, it is possible that a single phase is generated and grows. The single phase is a solid phase that is coarse and/or a typical compared with solid phases of the eutectic structure. The single phase can be visually distinguished from the solid phase of the eutectic structure. The single phase may not necessarily be different from the solid phase of the eutectic structure in composition; the compositions of these phases may be the same or similar.

The present inventors have studied and found that if the brazing material includes a coarse single phase with an equivalent circle diameter exceeding 5 μm, some of the brazing material may remain un-melted during the sealing, resulting in a possibility of damage to the lid main body or deteriorated airtightness. Also, the single phase is optional. A particularly preferable material structure of the brazing material according to the present invention includes a eutectic structure alone, with substantially no single phase. When there are a plurality of single phases observed, it is necessary that an average of their equivalent circle diameters be 5 μm. Preferably, the equivalent circle diameters of all the single phases in all the pieces of brazing material fused to the lid main body are 5 μm.

A specific material structure of the brazing material fused to the lid main body according to the present invention will be described with a Au—Sn brazing material close to the eutectic composition used as an example. The Au—Sn brazing material close to the eutectic composition involves deposition of two types of solid phases, namely, a δ phase (Au-37.6% by mass of Sn) and a ζ' phase (Au-10.8% by mass of Sn). The eutectic structure is a material structure including fine δ phases and fine ζ' phases that are periodically arranged complicated manner. The single phase generated in the Au—Sn brazing material of this composition includes δ and ζ' phases with the same compositions as the solid phases of the eutectic structure. The δ phase and the ζ' phase may deposit as single phases separately. These single phases are different from the δ phase and the ζ' phase of the eutectic structure in shape and size. Specifically, the single phase has an outer shape such as a blob shape or an island shape, which is different from those of the phases in the eutectic structure, and has a coarse size. Depending on the fusing condition of the brazing material, the single phase can be coarse with an equivalent circle diameter exceeding 5 μm. As described above, the solid phases that deposit in the Au—Sn brazing material close to the eutectic composition are the δ phase and the ζ' phase. Thus, the material structure preferably includes: the eutectic structure including the δ phase and the ζ' phase; and, optionally, a δ phase or a ζ' phase having an equivalent circle diameter of equal to or less than 5 μm.

In the present invention, in which a plurality of pieces of brazing material are fused on the joining region on the lid main body, this material structure is preferably obtained on a random cross section of a randomly selected brazing material. Preferably, the material structure is obtained on a plurality of any cross sections of all the pieces of brazing material.

B-4. Shape of Brazing Material (Shape Index)

As described above, the dimension/shape of the brazing material fused to the joining region of the lid main body is not particularly limited. Still, the present inventors have found a preferable shape of the brazing material as a condition for preventing damage such as cracking and breaking on the lid main body at a higher level, in the step of fusing the brazing material on the lid main body and the step of melting again/curing the brazing material for sealing.

Specifically, the brazing material fused on the lid main body has a shape index ($I_s$) that is preferably within a range of between 0.9 and 2.5, both inclusive. The shape index ($I_s$) is defined in the following formula.

$$\text{Shape index}(I_s) = A^{1/2}/V^{1/3}, \quad \text{[Formula 1]}$$

where

A represents the joining area between the lid main body and the brazing material (mm$^2$), and V represents the volume of the brazing material (mm$^3$)

The shape index ($I_s$), which is based on a relationship between the volume (V) of the brazing material and the joining area (A) between the lid main body and the brazing material, indicates that the brazing material with a substantial amount of volume needs to be fused with an appropriate joining area (contact area). Specifically, an excessively large joining area relative to the volume of the brazing material results in relatively a large amount of thermal stress produced in the step of curing the brazing material in molten state. Low-rigidity translucent materials are largely affected by thermal stress. In addition, there are differences in expansion/contraction coefficient between the brazing material and metal and/or ceramics constituting the package main body. In view of this, the excessively large joining area as described above is likely to result in damage such as breaking.

The brazing material is parameterized using the shape index ($I_s$) as described above is for the purpose of preventing breaking of the lid in the step of fusing the brazing material and in the step of joining the lid main body and the package main body to each other. The present inventors have found that when $I_s$ exceeds 2.5, the lid is damaged such as in the form of cracking. On the other hand, when $I_s$ is smaller than 0.9, this indicates that the joining area of the brazing material is too small. In this case, the lid main body is less likely to be damaged, but the adhesiveness of the brazing material to the lid main body is insufficient. This may cause the brazing material to fall off when the package is handled; may cause the brazing material to be displaced in the step of joining to the package main body; and may make the joining insufficient. In view of this, in the present invention, the shape index ($I_s$) is set to be within a range of between 0.9 and 2.5, both inclusive. The shape index ($I_s$) of at least one of the pieces of brazing material on the lid main body is preferably within this range. More preferably, the average value of the shape indices ($I_s$) of all the pieces of brazing material on the lid is within the range. Even more preferably, the shape indices ($I_s$) of all the pieces of brazing material are within the range.

The brazing material preferably has a shape that is substantially circular in a vertical projection view. Specific preferable shapes of the brazing material include a sphere shape and a semispherical shape, as well as a shape formed by two or more spheres stacked one on top of the other. FIG. 3 illustrates example relationships between the shape/dimension and the shape index ($I_s$) of the brazing material. In the examples, a plurality of pieces of brazing material having the same volume are illustrated in cross-sectional views taken along their center portions. The examples also illustrate a relationship between the shape index ($I_s$) and a change in the joining area with the lid main body. FIG. 4 illustrates examples of the shape of the brazing material after the fusing. The examples illustrated in FIG. 3 and FIG. 4 indicate that the shape of the brazing material can be a sphere shape and a semispherical shape, and can also be a shape formed by two spheres stacked one on top of the other.

The brazing material fused to the lid main body in the present invention may satisfy one of the above-described preferable conditions, namely: the preferable condition (the eutectic structure and a fine single phase) related to the material structure; and the preferable condition (shape index ($I_s$)) related to the shape/dimension. It is also possible, however, that both of the conditions are satisfied, which can be realized by adjusting the fusing method/condition.

C. Other Configurations of Sealing Lid According to the Present Invention

Essential components of the sealing lid according to the present invention are: the lid main body made of a translucent material such as glass; and the brazing material made of a eutectic alloy and fused on the lid main body. The sealing lid may further include additional components such as a metallized film and a function film formed on one or both surfaces of the lid main body.

C-1. Metallized Film

In the present invention, preferably, at least a single layer of metallized film made of metal is provided at least on a part of the brazing material fusing surface of the lid main body, and the brazing material is fused on the metallized film. The metallized film is used mainly for the purpose of increasing the adhesiveness of the brazing material to the lid main body. The brazing material is made of metal (eutectic alloy) and thus is a material of a type different from the translucent material such glass. Thus, depending on the composition, the brazing material might fail to be fixed due to insufficient adhesiveness to the lid main body. In view of this, the metallized film made of metal is used to secure the adhesiveness of the brazing material, preventing the brazing material from falling off the lid main body. The metallized film may have either a single layer structure or a multi-layer structure. For a specific configuration of the metallized film, various types of metal layers are contemplated in accordance with the functions of the metallized film.

C-1-1. First Metal Layer Formed on Brazing Material Fused Surface

A function of the metallized film is to improve the adhesiveness of the brazing material to the lid main body. The metallized film for such a purpose preferably has a first metal layer made of at least one of Au and Pt formed on the brazing material fused surface. This is because Au or Pt has satisfactory adhesiveness to the brazing materials of the various specific examples described above. This first metal film may also include a single layer or multiple layers. Any one of Au or Pt may be used, or layers of these metals may be stacked (Au/Pt, Pt/Au). If the first metal film is excessively thin, the underlying layer may be exposes, resulting in insufficient adhesiveness. If the first metal film is excessively thick, the first metal film may react with the brazing material in the joining step, resulting in a joining failure and/or a reduction in joining strength. In view of this, the first metal film preferably has a film thickness in a range of between 0.01 µm and 1 µm, both inclusive.

C-1-2. Second Metal Layer Formed on Lid Main Body Surface

The above-described first metal film made of Au and/or Pt and formed on the brazing material fused surface may have insufficient adhesiveness to the translucent material of the lid main body. In view of this, a second metal film is preferably formed as a metallized film that improves the adhesiveness between the lid main body and the first metal film on which the brazing material is fused. The second metal film is made of at least one of Mg, Al, Ti, V, Cr, Mn, Fe, Co, Ni, Cu, Zn, Ga, Ge, Zr, Nb, Mo, Ru, Rh, Pd, Ag, In, Sn, Sb, Ta, W, Re, Os, and Ir. These metals have satisfactory adhesiveness to both of the translucent material and Au/Pt, and thus enable the brazing material to be conveniently fixed on the lid main body. Of the metals, Cr and Ti are highly active metals and thus enable formation of a metallized film with high adhesiveness to the lid main body surface. Ni has excellent protection performance and can be used for forming a metallized film that prevents oxidation/deterioration of the underlying layer. Thus, it is preferable to form a metallized film made of a second metal layer made of at least one of Cr, Ti, and Ni.

A specific and preferred configuration of the second metal layer is as follows. A metal layer made of any of Cr or Ti, which is highly active, is formed as an adhesion layer. A metal layer made of Ni is formed as a protective layer on the adhesion layer (Cr/Ni, Ti/Ni). Although Cr and Ti have high adhesiveness, their highly active property leaves a concern about oxidation and deterioration caused by outside air. In view of this, the protective layer made of Ni is formed on the adhesion layer to prevent oxidation and the like of the adhesion layer, which is the underlying layer. The second metal layer is particularly preferably a metal layer made of the adhesion layer and the protective layer as described above. Preferably, in the second metal layer with this configuration, the adhesion layer has a film thickness within a range of between 0.04 µm and 0.1 µm, both inclusive, and the protective layer has a film thickness within a range of between 0.1 µm and 2 µm, both inclusive.

The metallized film described above preferably has both of the first metal layer (Au, Pt), which serves as the brazing material fused surface, and the second metal layer (Cr, Ti, Ni) on the lid main body surface side. It is to be noted that Pt is also effectively used as a metal constituting the protective layer in the second metal layer. In view of this, a metallized film (Cr/Pt, Ti/Pt) having the adhesion layer made of Cr or Ti and the protective layer made of Pt can also be used. In this case, Pt, which serves as the protective layer, can also serve as the first metal layer. It is possible, therefore, to fuse the brazing material on the surface of the protective layer made of Pt. A metal made of Au may be additionally formed.

The first and second metal films to serve as the metallized film described above can be formed by one or a combination of known thin film formation techniques such as sputtering, plating, and deposition. The metallized film may be formed over a wide range of the lid main body or may be limited to a necessary portion for the purpose of increasing the amount of transmitting light. For example, the metallized film may have a frame shape corresponding to the outer shape of the lid main body, and may be used as the joining region of the lid main body.

C-1-3. Diffusion Region Formed by Metallized Film

If the metallized film is used in the sealing lid according to the present invention, the brazing material is fused on the lid main body while being in contact with the metallized film. In this process, the metal element of the metallized film may diffuse into the brazing material in the interface between the brazing material and the metallized film. In the present invention, the amount of metal element diffusing into the brazing material is preferably minimized. Specifically, the width of a diffusion region that may be formed in the brazing material by the diffusion preferably equal to or less than 2 µm. Excessive diffusion of the metal element into the brazing material may cause a change in the composition of the brazing material and generation of a compound in an area close to the interface. This change in the composition of the brazing material and the generation of a compound may cause a change in the melting point, deteriorate the joining strength, and cause a leakage. In view of this, a state in which the diffusion is not excessive is preferable. The width of the diffusion region can be measured by an appropriate analysis method or device that determines presence or absence of the metal (Pt or Ni in many cases) component of the metallized film but that is not a component of the brazing material. The width of the diffusion region is preferably equal to or less than 1 µm. The lower limit of the width of the diffusion region, which is lower the better, is preferably 0.001 µm.

C-2. Function Film for Adjustment of Transmittance and the Like

In addition to the metallized film, a function film may be formed on one or both of the front and back surfaces of the lid main body of the present invention, for the purpose of increasing the transmittance or reflectance of light of a particular wavelength. A specific material of this function film is MgF$_2$. For example, for transmittance of an ultraviolet ray with a wavelength of 250 nm to 400 nm, the thickness of the film is preferably set to be within a range of between 60 and 100 nm, both inclusive.

D. Method for Producing Sealing Lid According to the Present Invention

Next, a method for producing the sealing lid according to the present invention will be described. The lid according to the present invention can be produced by fusing one or a plurality of pieces of brazing material on the lid main body made of a translucent material.

According to the present invention, in order to obtain a sealing lid with satisfactory joinability while exploiting the advantages of the eutectic alloy, it is intended that the material structure and/or shape/dimension of the brazing material after the fusing are made appropriate. The following description focuses on a method for fusing the brazing material on the lid main body while achieving an appropriate material structure and/or shape/dimension of the brazing material.

The lid main body on which the brazing material is fused is prepared by shaping a translucent material into a desired shape/dimension in advance. Also, since the lid is a small member, the shaping may be performed on a large plate material from which a plurality of lids can be formed. In this case, after the brazing material has been fused, the plate can be cut into lids as end products. Also, when the metallized film is formed, a metal film to be the metallized film is formed in advance before the brazing material is fused.

The brazing material can be fused by melting and then curing the solid brazing material on the lid main body. It is to be noted, however, that considering the shape (shape index ($I_s$)) of the brazing material, the brazing material with a satisfactory shape is preferably fused. As a possible method for achieving a satisfactory shape index of the solid brazing material, it is possible to: place, on the lid main body, a plurality of blob shaped or granular pieces of preproduced brazing material of a predetermined size; and then heat the brazing material. When granular pieces of brazing material are arranged, they may be individually positioned by use of a jig and the like and heated in this state. In this manner, spherical or semispherical pieces of brazing material can be fused. Preferably, the pieces of brazing material have a size with a diameter being equal to or larger than 0.05 mm and equal to or less than 0.25 mm.

It is to be noted, however, that a more preferable method for fusing the brazing material is to attach the brazing material in molten state to the lid main body and then cure the brazing material. A preferable material structure of the brazing material according to the present invention mainly includes a fine eutectic structure and include no coarse single phase. In order to form a fine eutectic structure, it is preferable to, in addition to adjusting the brazing material composition, rapidly cool the brazing material in molten state. In order to rapidly cool the brazing material in this manner, it is preferable to attach the molten brazing material to the lid main body and let the brazing material cool utilizing the lid main body and atmosphere.

Attaching the brazing material in molten state to the lid main body is also preferable in terms of adjustment of the dimension/shape of the brazing material. In molten state, the volume of the brazing material to be fused can be conveniently adjusted by adjusting the liquid measure of the liquid brazing material. Also, the shape and the joining area of the molten brazing material hitting the lid main body can be changed based on the kinetic energy involved in the attaching of the molten brazing material. In this manner, the shape index ($I_s$) of the brazing material can be adjusted.

An example of the method for supplying and fusing the brazing material in molten state on the lid main body is to attach droplets of a molten brazing material in advance on the lid main body using a biasing device. In this method, the droplets of the molten brazing material are rapidly cooled upon being attached to the lid main body, and thus the fusing is completed instantaneously. With this method, the shape index and/or the joining area of the fused brazing material can be adjusted by controlling the volume and the speed of the droplets of molten brazing material supplied to the lid main body.

Also with this method, the brazing material can be fused even if the lid main body is kept at normal temperature. This is because the volume of a droplet of brazing material is much smaller than the volume of the lid main body, so that the brazing material is instantaneously cooled and cured upon contact with the lid main body. Although the lid main body may be cooled at the time of the fusing, if the brazing material is fused with the lid main body cooled to an excessively low temperature, the lid main body might be damaged by thermal shock caused by a temperature difference between the brazing material and the lid main body. It is to be noted that the temperature of the lid main body in the step of fusing the droplets of the brazing material is preferably lower than the melting point of the brazing material by 100° C. or lower. This is for the purpose of making the cooling rate high enough for the fused brazing material to have a fine material structure (eutectic structure).

In the production of the lid according to the present invention, the method for fusing the brazing material on the lid main body is not limited to the methods described above. For example, the brazing material can be fused by: attaching a spherical brazing material to a tip of a capillary capable of discharging gas; melting the brazing material using a laser beam; and blowing the brazing material on to the lid main body using the gas. The brazing material can also be fused by: melting a bar/wire shaped brazing material from the tip using a laser beam; and concurrently blowing the molten part of the brazing material onto the lid main body. With these methods as well, the brazing material in molten state can be fused on the lid main body, so that the fused brazing material has a satisfactory shape/dimension. These methods also ensure that the brazing material can be fused even if the lid main body is kept at normal temperature.

In the above-described manner, the brazing material in molten state is attached to the lid main body, and the brazing material is rapidly cooled and fused. In this method, a plurality of pieces of brazing material are usually fused on the joining region of the lid main body, and for this purpose, the plurality of pieces of molten brazing material are continuously discharged/supplied to be fused. Thus, the sealing lid according to the present invention is obtained.

Advantageous Effects of Invention

As described above, the sealing lid according to the present invention is useful as a lid of a package using an optical element. In the present invention, the lid is made entirely of a translucent material such as glass. This makes the efficiency of use of light of the optical element in the package satisfactory. Also, a brazing material made of a eutectic alloy is used as a joining material for hermetic sealing. Such brazing material is effective for firm hermetic sealing, has excellent durability, and is not deteriorated by ultraviolet rays or the like. Also, by controlling the brazing material at appropriate material structure and/or shape/dimension, the brazing material is fused without damaging the lid main body and advantageously functions in the sealing step.

BRIEF DESCRIPTION OF DRAWINGS

FIG. 9 illustrates a material structure of a brazing material (No. A4) fused in the process a.

MODES FOR CARRYING OUT THE INVENTION

The following describes an embodiment of the present invention. In this embodiment, a lid main body was made of quartz glass, which is a translucent material. To this lid main body, a Au—Sn brazing material, which is a brazing material of a eutectic alloy, was fused using various methods to produce a sealing lid. The lid thus produced was tested for its joining performance relative to a package main body to evaluate whether the lid main body was damaged. The lid also underwent a sealing test to confirm its airtightness performance.

The lid main body used in this embodiment is a flat plate (3.4 mm×3.4 mm with a thickness of 0.3 mm) made of quartz glass or borosilicate glass. In this embodiment, a metallized film was formed in a frame region (outer size: 3.2 mm×3.2 mm, inner size: 2.5 mm×2.5 mm) on the surface of the glass lid main body.

The metallized film was formed by providing thin films of metals Cr (60 nm)/Ni (200 nm)/Au (100 nm) in this order from the lid main body surface. In some examples, a metallized film formed by providing Ti (60 nm)/Pt (200 nm)/Au (100 nm) in this order was used.

To the glass lid main body prepared as described above, a brazing material was fused. As the brazing material, a Au-22% by mass Sn brazing material was used. In this embodiment, the brazing material was fused to the lid main body to produce a lid by the following three different processes a to c.

Figure 1A:
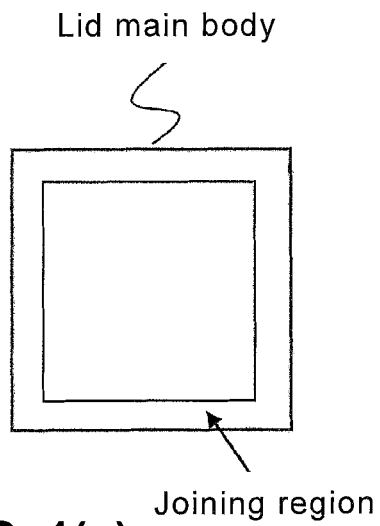
FIGS. 1(a), 1(b), 1(c), and 1(d) illustrate joining region examples in a lid main body according to the present invention.
Figure 1B:
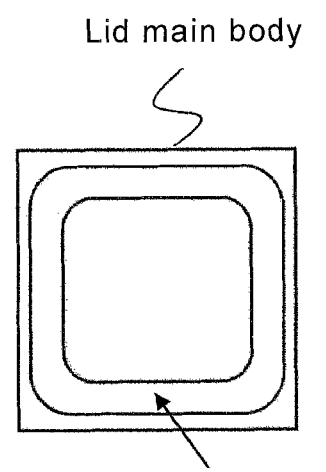
Figure 1C:
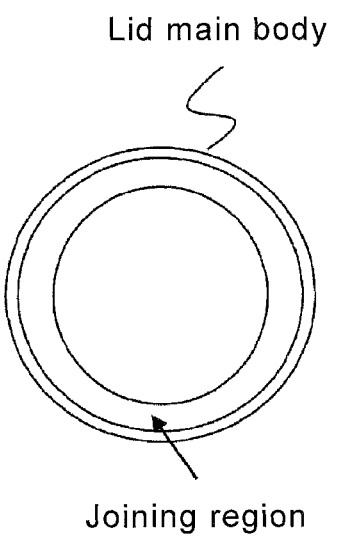
Figure 1D:
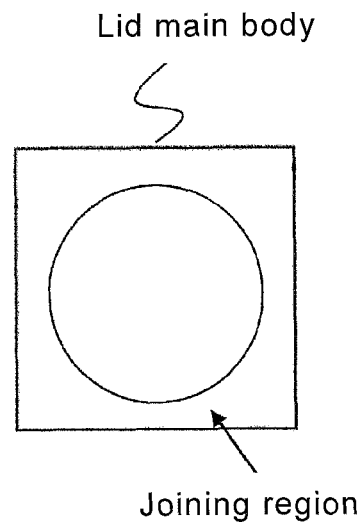
Figure 2:
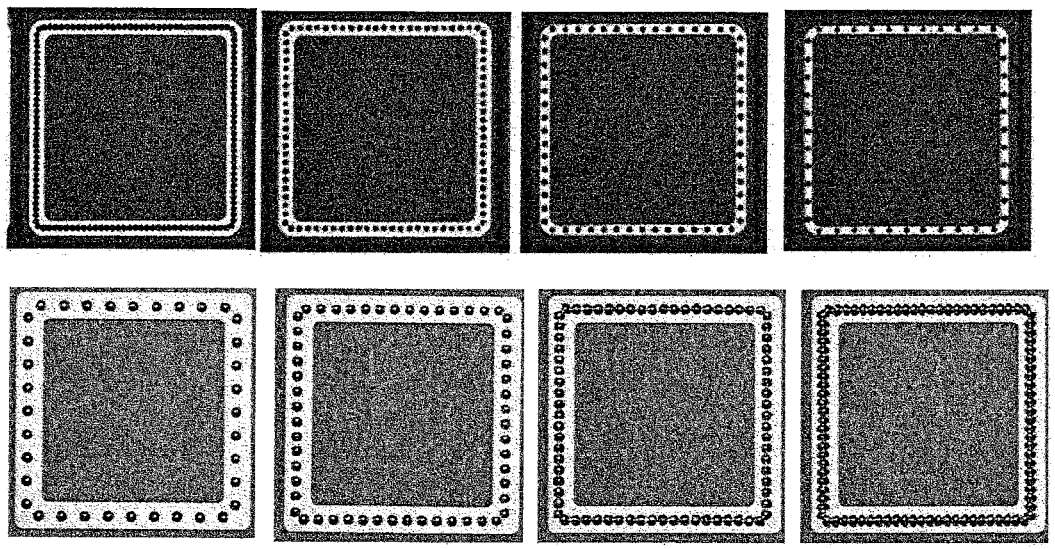
FIG. 2 illustrates arrangement examples of a plurality of brazing material fused on the lid main body according to the present invention.
Figure 2:
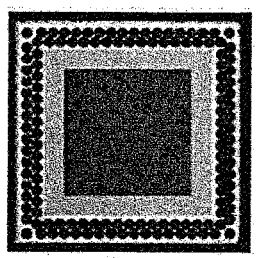
Figure 2:
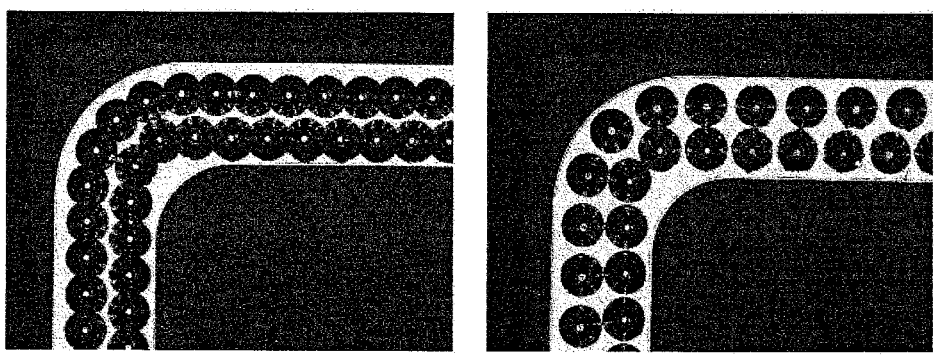
Figure 3:
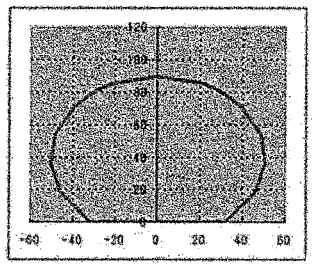
FIG. 3 illustrates a relationship between a shape index ($I_s$) and a shape/dimension of the brazing material fused on the lid main body.
Figure 3:
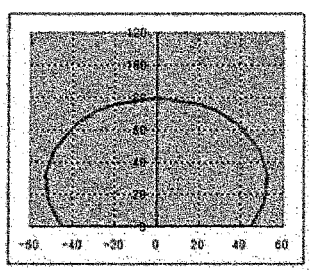
Figure 3:
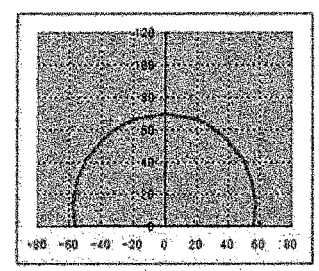
Figure 3:
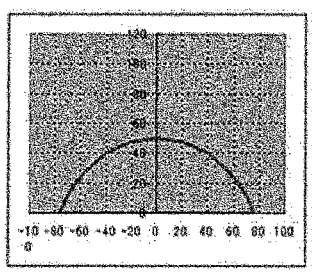
Figure 3:
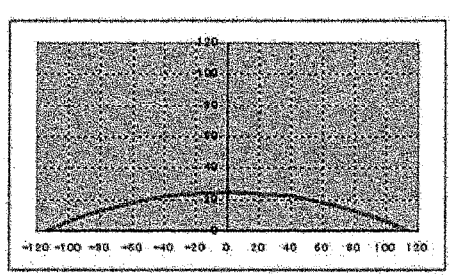
Figure 4:
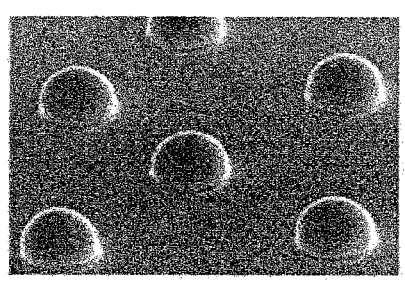
FIG. 4 illustrates examples of the shape (semispherical shape, stacked shape) of the brazing material fused on the lid main body.
Figure 4:
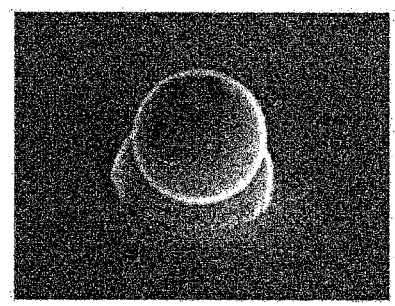
Figure 5:
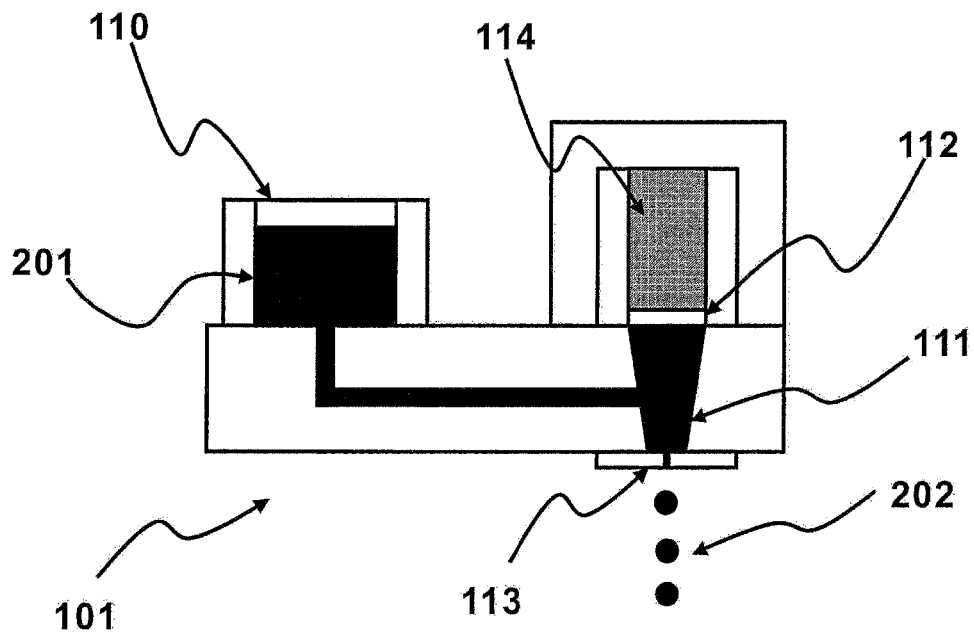
FIG. 5 illustrates a configuration of a brazing material ejection device (process a) for fusing the brazing material.

Process a: In this process, the brazing material was fused with the use of a brazing material ejection device containing pre-molten brazing material to produce a lid. FIG. 5 illustrates a detailed configuration of this brazing material ejection device 101. The ejection device 101 includes: a tank 110, which contains a brazing material 201 and is kept at a controlled temperature so as to maintain the material in molten state; a chamber 111, which communicates with the tank 110; a diaphragm 112 and an aperture 113, which are for ejecting the brazing material 201 contained in the chamber 111; and a piezoelectric actuator 114, which drives the diaphragm 112.

In the fusing of the brazing material using this ejection device 101, the piezoelectric actuator 114 is controlled and driven by a computer to cause a fixed amount of the brazing material 201 in the chamber 111 to be ejected through the nozzle. By controlling the size of the aperture 113 and the drive amount and change rate of the piezoelectric actuator 114, the volume and airborne speed of the ejected brazing material 202 is adjusted. The lid main body is placed on a stage that is movable in the X, Y, and Z directions. By driving this stage, the brazing material can be fused continuously in a frame shape on the lid main body.

Figure 6:
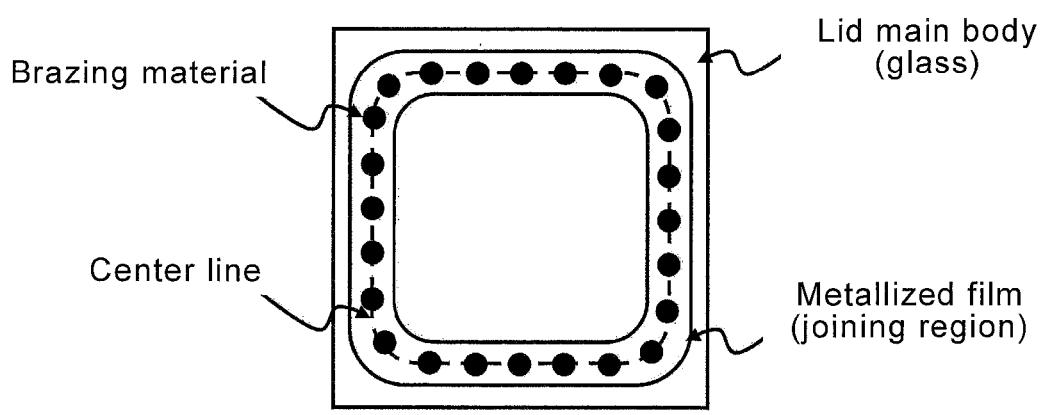
FIG. 6 illustrates positions where the brazing material is fused by means of the brazing material ejection device (process a)
Figure 7:
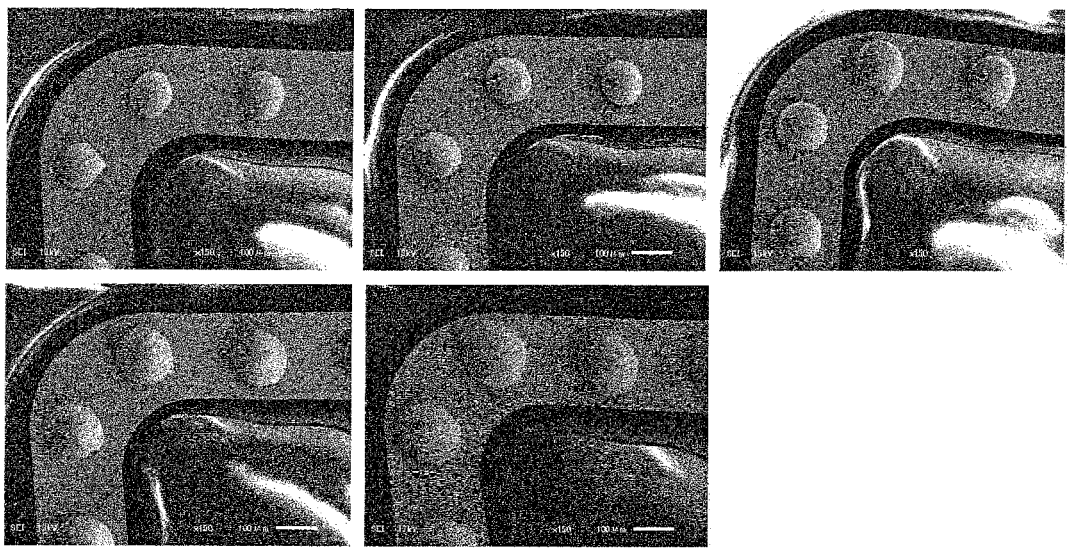
FIG. 7 illustrates external views of the brazing material fused by means of the brazing material ejection device (process a)

In this embodiment, as illustrated in FIG. 6, the brazing material was fused continuously in a row along the center position of the frame shaped metallized film, thereby shaping the brazing material into a frame. In this embodiment, in this process a, the size of molten metal droplets ejected was set to ø0.1 mm or ø0.125 mm in terms of sphere diameter, and the airborne speed of the brazing material was set to 1.6 m/second or higher. In addition, the number of pieces of the brazing material fused was calculated so that the thickness of the brazing material layer joined to the package main body would range from 10 to 25 μm, and the pieces were placed on the lid main body at substantially equal intervals. It is to be noted that the temperature of the stage on which the lid main body was place was set to normal temperature. FIG. 7 illustrates an example external view of the lid produced by fusing the brazing material in this process a.

Figure 8:
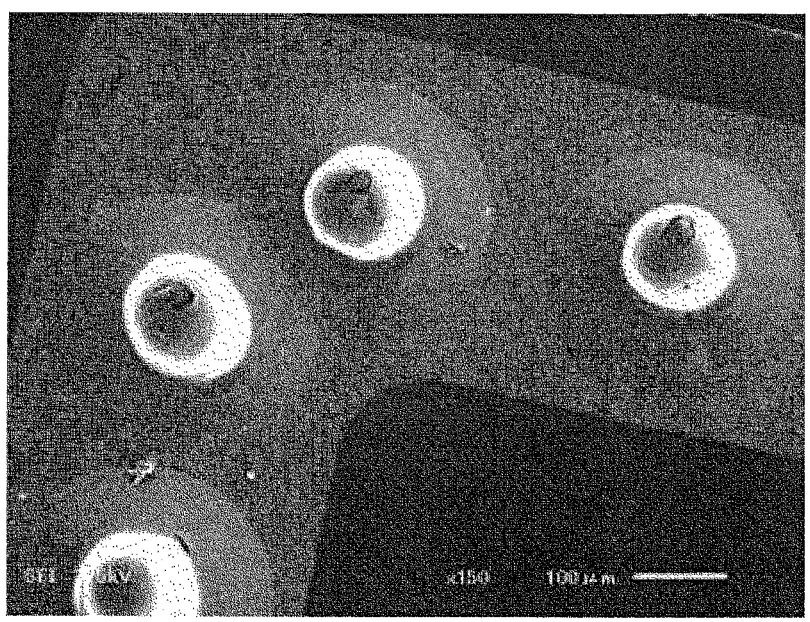
FIG. 8 illustrates an external view of ball shaped pieces of brazing material fused in a process b.

Process b: In this process, small blobs (ball shapes) of solid brazing material produced in advance were fused to the lid main body. In this embodiment, ball-shaped pieces of the brazing material having a diameter of ø0.1 mm were placed on a frame shaped metallized film on the lid main body at substantially equal intervals. In this process, a carbon jig having ø0.15-mm holes arranged in a frame shape was superimposed on the lid main body, and ball shaped pieces of the brazing material were sequentially inserted into the respective holes of the jig. Then, with the jig superimposed on the lid main body without displacement, the brazing material was fused through heating the brazing material for 1 minute or longer at 320° C. in an electric furnace of non-oxidizing atmosphere. In this process b, a lid on which the brazing material was placed similarly to the process a was produced. FIG. 8 illustrates an example external view of the lid produced by fusing the brazing material in the process b.

Process c: In this process, a piece of brazing material processed in a frame shape in advance was fused to the lid main body to produce a lid. This process serves as a comparative example relative to the above-described processes a and b. First, a Au-22% by mass Sn brazing material was punched out into a rectangular frame shape (outer size: 3.15 mm×3.15 mm, inner size: 2.5 mm×2.5 mm, thickness: 15 μm, 25 μm). Then, this preformed brazing material was placed on the lid main body, and reflowed and fused at 305° C. in a non-oxidizing atmosphere.

Based on the methods of the above-described processes a to c, pieces of brazing material having various shapes and dimensions were fused to a glass lid main body to produce sealing lids. For each type, ten sealing lids were produced. The sealing lids after the fusing step were examined for any break, cracking, or the like in the lid main body visually and under an optical microscope, and the number of non-defective products out of 10 was counted for evaluation in terms of proportion (non-defective rate).

Also, a material structure on a random cross section of the brazing material was observed. For structure observation of the lids produced in the processes a and b, pieces of brazing material were randomly selected; the lid main body was cut in the vicinity of the selected piece of brazing material and embedded with resin; the lid main body was polished as appropriate to make the cross section of the brazing material exposed; and the cross section was subjected to an observation. For the lids produced in the process c, the lid was cut at an arbitrary position on the lid and embedded with resin, and then polished as appropriate to observe the material structure on the cross section of the brazing material.

In the observation of the material structure, first, the entire cross section of the brazing material was observed to see if there was any eutectic structure or single phase. Then, a main part of the cross section was magnified to measure the size of the single phase. In this embodiment, a eutectic structure was observed in all of the brazing materials fused in the processes a to c. For the processes b and c, some solid phases were observed to be clearly coarser than the solid phase constituting the eutectic structure. The equivalent circle diameter of the single phase was calculated based on an image magnified by 1500 to 2500 times obtained through SEM (acceleration voltage 15 kV). In a case where a plurality of single phases were observed, the average value of these was calculated. In a case where no solid phase identified as a single phase was clearly observed, in other words, for the brazing material with which only a eutectic structure was substantially observed, magnified images of arbitrary portions were obtained; five solid phases were randomly extracted from the images; their equivalent circle diameters were determined; it was confirmed that none of them exceeded 5 µm; and it was confirmed that the equivalent circle diameter of the single phase was 5 µm or less. It is to be noted that the equivalent circle diameter refers to the diameter of a circle having the same area as the observed single phase.

The width of the region where metallized film components were diffused in the brazing material was also measured. This measurement was carried out through observing the interfaces of the samples used in the cross-section observation with the metallized film of the brazing material through EPMA (electron-beam microprobe analysis) and conducting an elemental analysis. The analysis conditions for EPMA were an acceleration voltage of 20 kV and a measurement magnification of 5000. In this elemental analysis, a line analysis was performed from the inside of the metallized film toward the inside of the brazing material. Then, the count of the metal components (Ni, Pt) in the metallized film was assumed as 100%. Based on this assumption, the count of these components decreasing toward the brazing material was tracked. The point at which the count of the components dropped to 10% or less was determined to be an edge of the diffusion region. Then, the distance between the interface and the edge of the diffusion region was determined to be the width.

Furthermore, for each lid produced, the shape index ($I_s$) of the fused brazing material was measured. In the measurement of the shape index, for the brazing material used for the lids produced in the processes a and b, the brazing material was peeled off the lids produced, and the average value of volumes based on the mass of the brazing material collected and the density and the number of pieces of brazing material was determined as the volume (V) of a piece of brazing material. As for the joining area (A) of the brazing material, the lid main bodies from which the brazing materials were peeled off were observed under a microscope; areas of the joining surfaces were measured; and the average of them was obtained. For the brazing material used for the lids produced in the process c, the volume (V) was determined from the dimensions of the pre-fused brazing material. Furthermore, the joining area (A) was calculated by measuring the profile of the post-fused brazing material.

Table 1 lists: observation and measurement results of material structures, shapes, and dimensions of the brazing materials sorted by the production processes for the sealing lids produced according to this embodiment; and occurrence of damage in the lid main bodies.

TABLE 1

| No. | Production process | Lid main body | Number of brazing material | Metallized film | Material structure Single phase equivalent circle diameter | Brazing material shape Joining area ($\times 10^{-3}$ mm$^2$) | Volume V ($\times 10^{-3}$ mm$^3$) | Shape index ($I_s$) | Diffusion region (µm) | Fused non-defective rate |
|---|---|---|---|---|---|---|---|---|---|---|
| A1 | a | quartz glass | 56 | Cr/Ni/Au | 5 µm or less | 3.74 | 0.57 | 0.7 | 0.5 | 9/10 |
| A2 | | | | | 5 µm or less | 6.23 | 0.59 | 0.9 | 0.5 | 10/10 |
| A3 | | | | | 5 µm or less | 12.47 | 0.52 | 1.4 | 0.5 | 10/10 |
| A4 | | | | | 5 µm or less | 18.70 | 0.55 | 1.7 | 0.5 | 10/10 |
| A5 | | borosilicate glass | | Ti/Pt/Au | 5 µm or less | 21.75 | 0.55 | 1.8 | 0.5 | 10/10 |
| A6 | | quartz glass | 112 | Cr/Ni/Au | 5 µm or less | 13.64 | 1.04 | 1.2 | 0.5 | 10/10 |
| A7 | | | | | 5 µm or less | 23.38 | 1.07 | 1.5 | 0.5 | 10/10 |

TABLE 1-continued

| No. | Production process | Lid main body | Number of brazing material | Metallized film | Material structure Single phase equivalent circle diameter | Brazing material shape | | | Diffusion region (μm) | Fused non-defective rate |
|---|---|---|---|---|---|---|---|---|---|---|
| | | | | | | Joining area ($\times 10^{-3}$ mm$^2$) | Volume V ($\times 10^{-3}$ mm$^3$) | Shape index ($I_s$) | | |
| A8 | | | | | 5 μm or less | 48.70 | 1.10 | 2.1 | 0.5 | 10/10 |
| A9 | | | 144 | | 5 μm or less | 68.18 | 1.04 | 2.6 | 0.5 | 9/10 |
| B1 | b | quartz glass | 56 | Cr/Ni/Au | 5.8 μm | 14.85 | 0.52 | 1.5 | 0.5 | 10/10 |
| B2 | | | | | 8.8 μm | 17.67 | 0.53 | 1.6 | 0.5 | 10/10 |
| B3 | | | | | 11.2 μm | 41.55 | 0.52 | 2.5 | 1.0 | 10/10 |
| B4 | | | | | 15 μm | 57.26 | 0.53 | 3.0 | 2.0 | 9/10 |
| C1 | c | quartz glass | 1 | Cr/Ni/Au | 2.4 μm | 3964 | 39.64 | 5.8 | 1.0 | 6/10 |
| C2 | | | | | 8.5 μm | 3964 | 79.28 | 4.6 | 3.0 | 2/10 |

Production process
Process a: droplets of molten brazing material (ejection device)
Process b: ball shaped brazing material
Process c: frame shaped preformed brazing material (C1: 15 μm thick, C2: 25 μm thick)

As can be seen from Table 1, the occurrence of damage in the lid main bodies was extremely limited in the lids to which spherical pieces of brazing material were continuously fused with the use of the ejection device in the process a (Nos. A1 to A9). In particular, as for the lids of Nos. A2 to A8, the post-fused brazing material had shape indices of 0.9 to 2.1, and all the lid produced were determined to be non-defective (fused non-defective rate: 10/10). By contrast, as for the lids of Nos. A1 and A9, the post-fused brazing material had shape indices of 0.7 and 2.6, and damage was observed in some of the post-fused lid main bodies.

Figure 9:
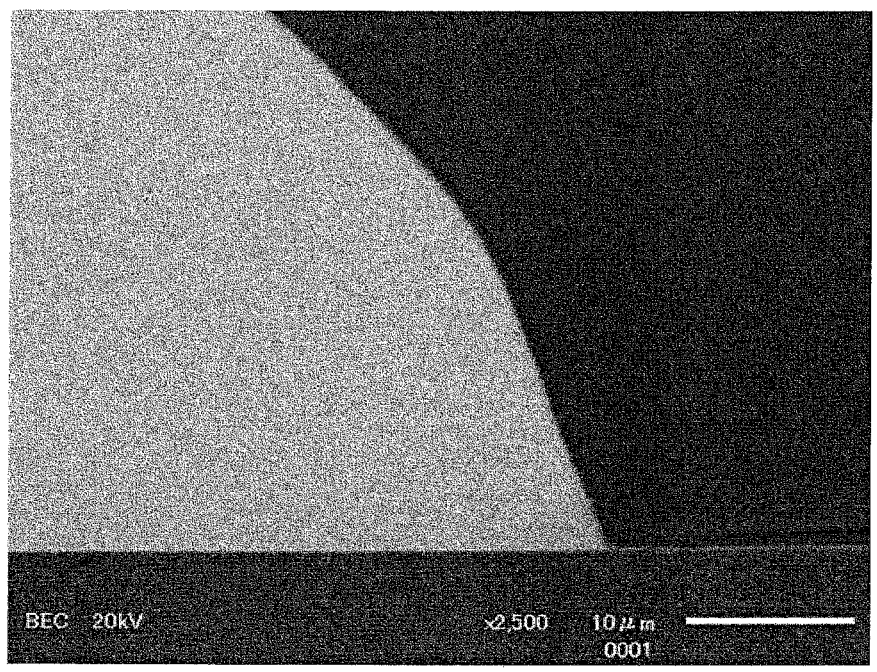

FIG. 9 illustrates an example cross sectional structure of the brazing material (No. A4) after the molten brazing material was fused in the process a. Almost the entirety of the brazing material fused to the lid main bodies according to this embodiment had a fine eutectic structure. The brazing material fused in the process a is expected to be less likely to include a coarse single phase. In the brazing materials fused in the process a, a single phase was identified based on the measurement criteria described above, with the result that the equivalent circle diameter was constantly 5 μm or less.

Figure 10:
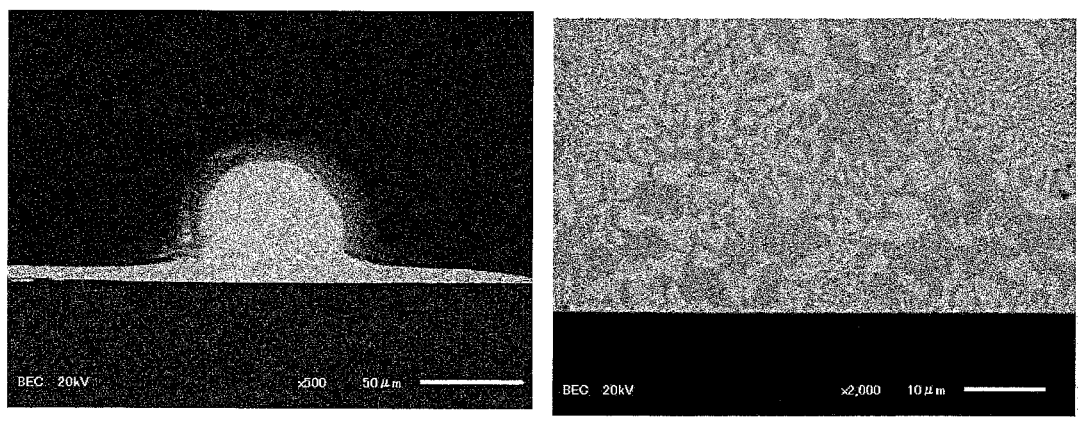
FIG. 10 illustrates a material structure of a brazing material fused in the process b.

For the lids to which the brazing material was fused in the process b, the brazing material has a similar shape to that of the brazing material in the process a, but has a different material structure. FIG. 10 illustrates the material structure of the brazing material (No. B2) fused in the process b. It was confirmed that, in addition to a eutectic structure, a single phase not belonging to the eutectic structure was generated. Since a Au—Sn brazing material was used in this embodiment, this single phase is presumably a 6 phase or phase. The measurement results of the particle diameter of the single phase in Table 1 show that the brazing material for the lids produced in the process b tends to generate a single phase, in addition to a eutectic structure. In the method for fusing the brazing material in the process b, the entire lid needs to be heated with the brazing material inserted in the jig, which requires a longer period of cooling time. This is presumably why the single phase is generated and grown.

It should be noted that the process b is a process by which the shape of the brazing material can be controlled. As for the lids in Nos. B1, B2, and B3, the brazing material successfully achieved shape indices of 1.5 to 2.5. Since no damage was observed in the lid main bodies, they can be presumably used for sealing packages. By this process b, a plurality of ball shaped small masses of brazing material can be fused, and thus the occurrence of damage in the lid main bodies during the fusing can be reduced.

It can be seen that compared with the examples of these processes a and b, the pieces of brazing material (Nos. C1 and C2) preformed in a frame shape in the process c tend to case cracking in the glass lid main body in the fusing process. These pieces of brazing material had large shape indices ($I_s$) ranging from 4.6 to 5.8. Such large shape indices ($I_s$) are because of an excessively large joining area for the preformed brazing material in a frame shape. Since brazing materials are different from glass in thermal expansion/contraction behavior, a larger joining area results in a larger residual stress when the brazing material is cured. Brazing materials having a large joining area like this brazing material in a frame shape relatively tend to have cracking due to residual stress.

Figure 11:
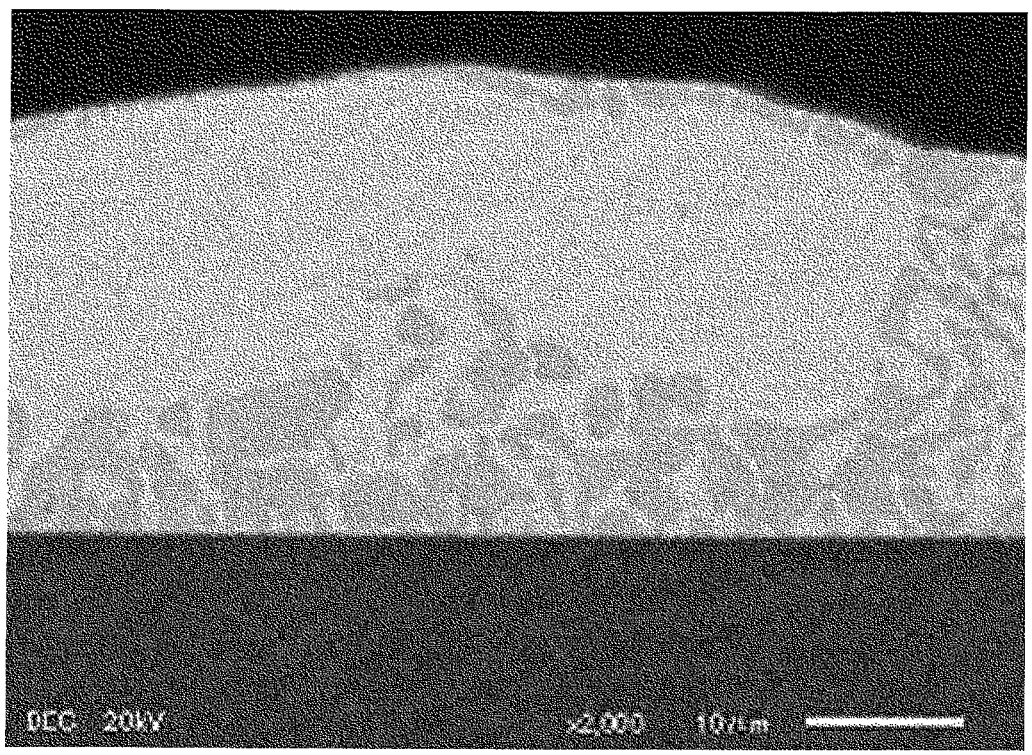
FIG. 11 illustrates a material structure of a brazing material (No. C2) fused in a process c.

Regarding the material structure of the preform brazing material in a frame shape, it is considered to be difficult to produce a preferable material structure having only a eutectic structure. FIG. 11 illustrates a cross sectional structure of the brazing material after the preform brazing material (brazing material thickness 25 μm) of No. C2 was fused. It was observed that a small region of the material structure of this brazing material was occupied by the eutectic structure, and the rest of the material structure was occupied by a large number of coarse single phases having a particle diameter exceeding 5 μm in terms of equivalent circle diameter. In this process, while the brazing material is being fused, the lid main body is heated together with the brazing material by reflow. This elongates the time during which the temperature of the brazing material exceeds the melting point, making the cooling speed lower. This presumably made it easier for single phases to be deposited. This preform brazing material in a frame shape caused damage in the lid main body in the fusing step and thus was unusable for the subsequent sealing test. Even if cracking is small enough to endure the sealing test, it is likely that the coarse single phase would affect the airtightness.

Next, a sealing test using package main bodies were performed with respect to the lid main bodies produced in the processes a and b, in which no significant damage occurred after the brazing material was fused. In this sealing test, ceramic package main bodies (having opening dimensions (inner size) of 2.4 mm×2.4 mm and an opening edge end surface thickness of 0.8 mm) were prepared, and various sealing lids were joined to the package main bodies. In the package production method, each lid was superimposed on the corresponding package main body and positioned; the package was heated to 305° C. under a loading condition of 0.4 MPa; and the brazing material was re-melted. In this process, the set temperature was retained for 30 seconds, and upon elapse of the time, the heating was immediately stopped and cooling was started. After the package was sealed, the glass lid was examined under a stereoscopic microscope (20 times) for occurrence of cracking in the glass lid. In this evaluation, a parameter used was the number of lid main bodies (10 pieces) in the fusing step of the brazing material described above. In other words, those products that were damaged in the lid main bodies during the fusing of the brazing material were determined to be defective without subjecting them to the sealing test. The sealing test was conducted on those products determined as non-defective after the fusing of the brazing material, and the non-defective rate was evaluated.

Furthermore, those packages with no cracking in sealed lids were evaluated for airtightness, and the non-defective occurrence rate from the lid production step (brazing material fusing step) to the package production step (sealing step) was evaluated. The airtightness was evaluated through immersing the packages in a Fluorinert liquid heated to 120° C. and visually checking the generation of air bubbles from the inside of the packages. In this airtightness evaluation as well, a parameter used was the number of lid main bodies in the fusing step of the brazing material. The results of the sealing test are listed in Table 2.

in the brazing material in the process b, a partial composition change occurred. This presumably caused the melting point to vary, resulting in formation of a region where the brazing material was not completely molten and not caused to flow.

The results of non-defective rate evaluation in terms of airtightness show that the process a is superior to the process b. This is also presumably because of the coarse single phases generated in the process b. Because of the generation of coarse single phases, a high melting point region was generated, which presumably caused a leak path to be generated. Thus, in order to produce the most effective lid both in the lid production step (fusing of the brazing material) and the package production step (re-melting and curing of the brazing material for sealing), it is preferable to optimize the composition and shape of the brazing material and use a suitable material structure.

INDUSTRIAL APPLICABILITY

As has been described hereinbefore, the sealing lid according to the present invention uses a translucent material such as glass for the sealing lid, and uses a brazing material made of a eutectic alloy as a joining material for sealing. The use of each material has its own advantages. The present invention provides a package containing an optical element with effective efficiency of utilization of light and high durability. The present invention is suitable for sealing materials for various devices that use optical elements including light emitting elements such as LEDs and light receiving elements.

The invention claimed is:

TABLE 2

| No. | Production process | Material structure Single phase equivalent circle diameter | Shape index ($I_s$) 0.7 | Diffusion region (μm) | Sealing-time non-defective rate | Airtightness non-defective rate |
| --- | --- | --- | --- | --- | --- | --- |
| A1 | a | 5 μm or less | 0.7 | 0.5 | 9/10 | 8/10 |
| A2 |   | 5 μm or less | 0.9 | 0.5 | 10/10 | 10/10 |
| A3 |   | 5 μm or less | 1.4 | 0.5 | 10/10 | 10/10 |
| A4 |   | 5 μm or less | 1.7 | 0.5 | 10/10 | 10/10 |
| A5 |   | 5 μm or less | 1.8 | 0.5 | 10/10 | 10/10 |
| A6 |   | 5 μm or less | 1.2 | 0.5 | 10/10 | 10/10 |
| A7 |   | 5 μm or less | 1.5 | 0.5 | 10/10 | 10/10 |
| A8 |   | 5 μm or less | 2.1 | 0.5 | 10/10 | 10/10 |
| A9 |   | 5 μm or less | 2.6 | 0.5 | 9/10 | 8/10 |
| B1 | b | 5.8 μm | 1.5 | 0.5 | 8/10 | 6/10 |
| B2 |   | 8.8 μm | 1.6 | 0.5 | 9/10 | 5/10 |
| B3 |   | 11.2 μm | 2.5 | 1.0 | 8/10 | 7/10 |
| B4 |   | 15 μm | 3.0 | 2.0 | 7/10 | 5/10 |

Production process
Process a: droplets of molten brazing material (ejection device)
Process b: ball shaped brazing material (jig arranged)

The results of the non-defective rate evaluation in the sealing process show that the process a is superior to the process b. This is presumably because of the 5 μm or larger coarse single phases generated in the brazing material in the process b. Because of the generation of coarse single phases 1. A sealing lid that is joinable to a package main body containing an optical element and that is for producing a package hermetically sealed, the sealing lid comprising a lid main body comprising a translucent material comprising one of glass, crystal, sapphire, silicon and germanium, wherein the package main body consists of a metal or a ceramic, wherein the lid main body comprises a joining region having a frame shape corresponding to an outer circumferential shape of the lid main body, the joining region being formed on a surface of the lid main body that is to be joined to the package main body, wherein a plurality of pieces of brazing material comprising a eutectic alloy are fused on the joining region of the lid main body, and wherein a material structure of a random cross section of the plurality of pieces of brazing material consisting of (a) a eutectic structure and (b) a single phase having an equivalent circle diameter of equal to or less than 5 μm.

2. The sealing lid according to claim 1, wherein the plurality of pieces of brazing material are continuously fused on the joining region to form a frame shape.

3. The sealing lid according to claim 1, wherein at least one of the plurality of pieces of brazing material has a substantially circular projected shape.

4. The sealing lid according to claim 1, wherein at least one of the plurality of pieces of brazing material has a shape index (L) that is equal to or larger than 0.9 and equal to or less than 2.5, the shape index (L) being defined by a formula:

$$\text{shape index}(I_s) = A^{1/2}/V^{1/3} \qquad \text{[Formula 1]}$$

where A represents a joining area between the lid main body and the brazing material (mm$^2$), and V represents a volume of the brazing material (mm$^3$).

5. The sealing lid according to claim 1, wherein the brazing material comprising the eutectic alloy is a Au-based eutectic brazing material.

6. The sealing lid according to claim 1, wherein the brazing material comprising the eutectic alloy is a Au—Sn brazing material.

7. The sealing lid according to claim 1, wherein a metallized film comprising at least one layer comprising metal is provided on at least a part of the lid main body surface, and the brazing material is fused on the metallized film.

8. The sealing lid according to claim 7, wherein the metallized film comprises a first metal layer comprising at least one of Au and Pt on a brazing material fused surface of the metallized film.

9. The sealing lid according to claim 7, wherein the metallized film comprises a second metal layer comprising at least one of Mg, Al, Ti, V, Cr, Mn, Fe, Co, Ni, Cu, Zn, Ga, Ge, Zr, Nb, Mo, Ru, Rh, Pd, Ag, In, Sn, Sb, Ta, W, Re, Os, and Ir on a surface of the lid main body.

10. The sealing lid according to claim 7, wherein a diffusion region formed by diffusion of a metal element of the metallized film into the brazing material has a width of equal to or less than 2 μm.

11. The sealing lid according to claim 1, wherein the lid main body comprises a function film on one surface or both surfaces of the lid main body, the function film being for increasing transmittance or reflectance.

12. A hermetic sealing method comprising joining a sealing lid to a package main body, wherein the sealing lid joined is the sealing lid according to claim 1.

13. A package comprising the sealing lid according to claim 1.

14. The sealing lid according to claim 2, wherein at least one of the plurality of pieces of brazing material has a substantially circular projected shape.

15. The sealing lid according to claim 2, wherein at least one of the plurality of pieces of brazing material has a shape index (L) that is equal to or larger than 0.9 and equal to or less than 2.5, the shape index (L) being defined by a formula:

$$\text{shape index}(I_s) = A^{1/2}/V^{1/3} \qquad \text{[Formula 1]}$$

where A represents a joining area between the lid main body and the brazing material (mm$^2$), and V represents a volume of the brazing material (mm$^3$).

16. The sealing lid according to claim 1, wherein the translucent material is glass.

17. The sealing lid according to claim 1, wherein the package main body consists of a ceramic.

* * * * *